United States Patent
Fekih-Romdhane (10) Patent No.: US 7,362,633 B2
(45) Date of Patent: Apr. 22, 2008

(54) PARALLEL READ FOR FRONT END COMPRESSION MODE

(75) Inventor: Khaled Fekih-Romdhane, Houston, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/385,340

(22) Filed: Mar. 21, 2006

(65) Prior Publication Data
US 2007/0223293 A1 Sep. 27, 2007

(51) Int. Cl.
*G11C 29/00* (2006.01)

(52) U.S. Cl. ............ 365/201; 365/189.07; 714/718

(58) Field of Classification Search ............ 365/201
See application file for complete search history.

(56) References Cited

U.S. PATENT DOCUMENTS

| | | | | |
|---|---|---|---|---|
| 6,032,274 A | * | 2/2000 | Manning | 714/718 |
| 6,163,863 A | * | 12/2000 | Schicht | 714/718 |
| 6,307,790 B1 | * | 10/2001 | Roohparvar et al. | 365/189.05 |
| 6,584,025 B2 | * | 6/2003 | Roohparvar et al. | 365/201 |
| 6,950,971 B2 | * | 9/2005 | Boehler et al. | 714/710 |
| 7,046,563 B1 | * | 5/2006 | Kim | 365/201 |
| 2005/0152190 A1 | * | 7/2005 | Fukuda | 365/189.05 |

* cited by examiner

*Primary Examiner*—Son L. Mai
(74) *Attorney, Agent, or Firm*—Patterson & Sheridan, L.L.P.

(57) ABSTRACT

Methods and apparatus for increasing front-end testing throughput by allowing simultaneous access to multiple banks are provided. Techniques described herein take advantage of the reduced number of data lines required for transmitting compressed test data. Data lines effectively freed up due to compression of test data read from one bank may be used to carry test data for another bank.

13 Claims, 7 Drawing Sheets

PARALLEL READ FOR FRONT END COMPRESSION MODE

CROSS-REFERENCE TO RELATED APPLICATIONS

This application is related to U.S. patent application Ser. No. 11/385,539, entitled "MULTIPLE BANKS READ AND DATA COMPRESSION FOR BACK END TEST," filed on the same day as the present application and herein incorporated by reference in its entirety.

BACKGROUND OF THE INVENTION

1. Field of the Invention

The invention generally relates to semiconductor testing and, more particularly, to testing dynamic random access memory (DRAM) devices.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

During the manufacturing process, multiple DRAM devices are typically fabricated on a single silicon wafer and undergo some form of testing (commonly referred to as wafer or "front-end" test) before the devices are separated and packaged individually. Such testing typically entails writing test data patterns to a particular series of address locations, reading data back from the same address locations, and comparing the data patterns read back to the data patterns written, in order to verify device operation. In conventional wafer testing, to avoid contention on data buses shared between multiple banks of DRAM memory cells, a single bank is accessed at a time. In a standard test mode, all lines of a shared bus may be used. During a single bank read access, a burst of data is read from the bank, for example, with multiple bits of data read at each clock edge.

In some cases, in an effort to reduce the amount of test data that must be passed between devices and a tester, the data read from the device arrays may be compressed. For example, for some DRAM architectures, 16 bits of data may be read in each access to the array at every clock edge. These 16 bits may be compressed internally to 4 bits, for example, by comparing four data bits stored at cells formed at an intersection of a word line (WL) and a column select line (CSL), with a test data pattern written to those bits, to generate a single "pass/fail" bit. Because repair algorithms typically replace entire wordlines and/or column select lines (depending on the particular repair algorithm) that have a failing cell with redundant wordlines and/or redundant column select lines, it is not necessary to know which particular cell or cells failed.

While such compression reduces the amount of test data that must be handled, having to access a single bank at a time limits the throughput of front-end testing. Accordingly, what is needed is a mechanism for improving throughput of front-end testing.

SUMMARY OF THE INVENTION

Embodiments of the invention generally provide methods and apparatus for testing a memory device.

One embodiment provides a method of testing a memory device in a first test mode. The method generally includes, reading a plurality of bits from multiple banks of the memory device in parallel, generating, from the plurality of bits read from each bank, a reduced number of compressed test data bits, routing the compressed test data bits from each bank to a common set of data lines shared between the multiple banks, and providing the compressed test data bits as output on one or more data pins of the memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide methods and apparatus for increasing front-end testing throughput by allowing simultaneous access to multiple banks. Techniques described herein take advantage of the reduced number of data lines required for transmitting compressed test data. In other words, data lines effectively freed up due to compression of test data read from one bank may be used to carry test data for another bank.

Embodiments of the present invention will be described herein with reference to an embodiment of a DRAM device utilizing parallel access two banks of memory cells, with each group having four banks. However, those skilled in the art will recognize that the concepts described herein may be applied, generally, to access a wide variety of arrangements having different numbers of bank groups and, additionally, different numbers of banks in each group.

An Exemplary Memory Device

Figure 1:
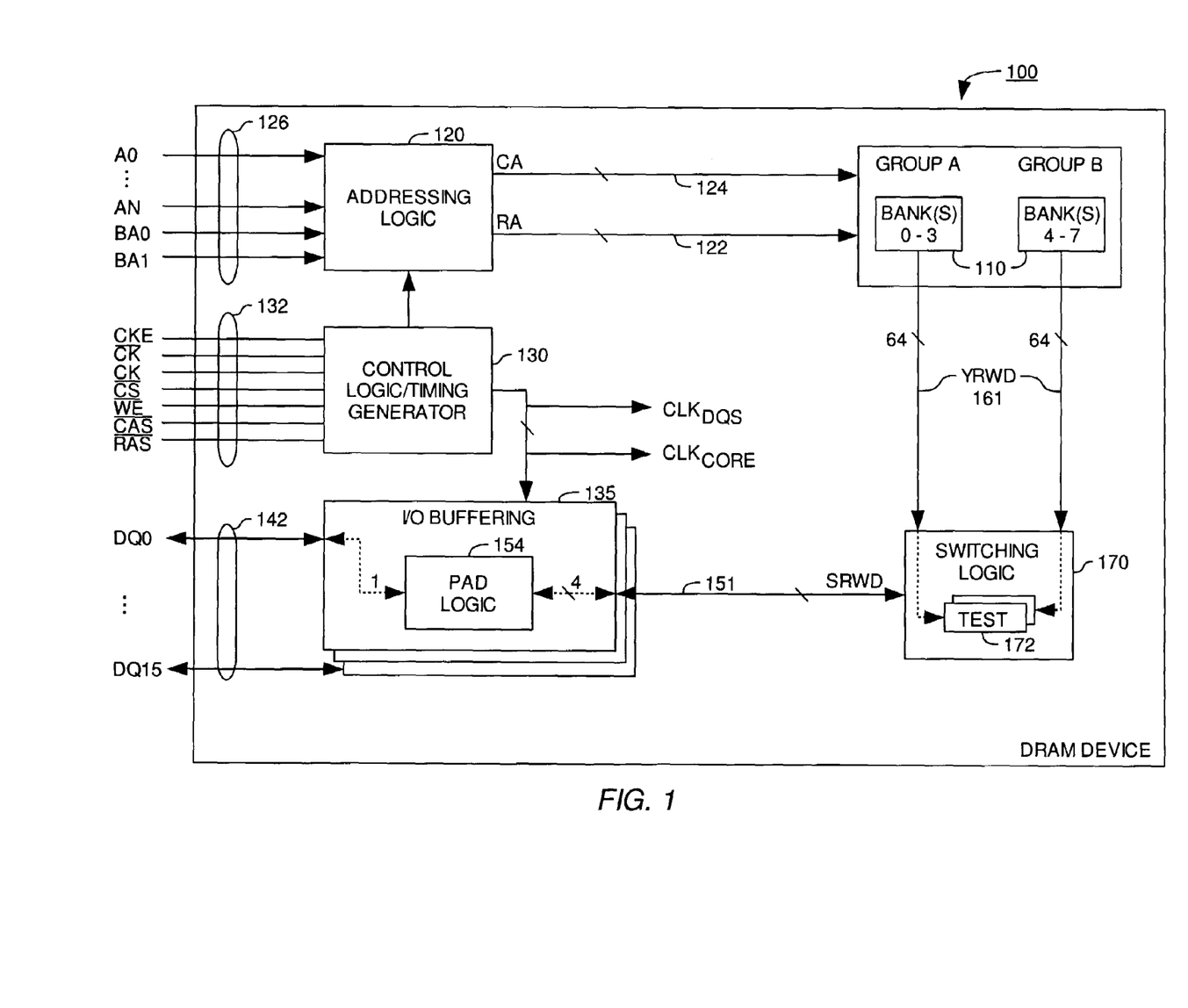
FIG. 1 illustrates a dynamic random access memory (DRAM) device in accordance with embodiments of the present invention.

FIG. 1 illustrates an exemplary memory device 100 (e.g., a DRAM device) utilizing a data path logic design in accordance with one embodiment of the present invention, to access data stored in one or more memory arrays (or banks) 110. As illustrated, the banks 110 may be divided into groups that share a common set of data lines (YRWD lines), with four banks in each group (e.g., banks 0-3 are in Group A and banks 4-7 in Group B). As will be described in greater detail below, the throughput of front-end testing may be increased by utilizing parallel reads to banks in each group.

As illustrated, the device 100 may include control logic 130 to receive a set of control signals 132 to access (e.g., read, write, or refresh) data stored in the arrays 110 at locations specified by a set of address signals 126. The address signals 126 may be latched in response to signals 132 and converted into row address signals (RA) 122 and column address signals (CA) 124 used to access individual cells in the arrays 110 by addressing logic 120.

Data presented as data signals (DQ0-DQ15) 142 read from and written to the arrays 110 may be transferred between external data pads and the arrays 110 via I/O buffering logic 135. The I/O buffering logic 135 may be configured to achieve this transfer of data by performing a number of switching operations, for example, including assembling a number of sequentially received bits, and reordering those bits based on a type of access mode (e.g., interleaved or sequential, even/odd).

In general, during a write operation, the I/O buffering logic 135 is responsible for receiving data bits presented serially on external pads and presenting those data bits in parallel, possibly reordered depending on the particular access mode, on an internal bus of data lines referred to herein as spine read/write data (SRWD) lines 151. Assuming a total of 16 external data pads DQ<15:0>, there will be 64 total SRWD lines 151 (e.g., I/O buffering logic 135 performs a 4:1 fetch for each data pad) for a DDR-II device (32 for a DDR-I device and 128 for DDR-III).

As illustrated, the SRWD lines 151 may be connected to switching logic 170, which allows the SRWD lines 151 to be shared between the different groups of banks 110. As illustrated, each group of banks may have another set of data lines, illustratively shown as a set of data lines (YRWDL) 161 running in the vertical or "Y" direction. While each group may have a set of YRWD lines 161, the YRWD lines 161 for a group may be shared between banks 110 in that group. The switching logic 170 is generally configured to connect the read/write data lines (RWDL's) to the appropriate YRWD lines depending on the bank, or banks as the case may be, being accessed.

During a read access, the data propagates in the opposite direction through the switching logic 170 and I/O buffering logic 135 to the DQ lines. In other words, data may be transferred from the memory arrays 110 to the YRWD lines 161 and to the SRWD lines 151, via the switching logic 170, and from the SRWD lines 151 to the DQ pads, via the I/O buffering logic 135.

Exemplary Test Logic

For some embodiments, test logic 172, may be included to reduce amount of test data transferred out of the DRAM device 100 during wafer testing. As illustrated, separate test logic 172 may be provided for each group of banks 110. While the test logic 172 is shown as being included in the switching logic 170, for some embodiments, the test logic 172 may be located elsewhere, for example, locally within the groups of banks 110.

Figure 2:
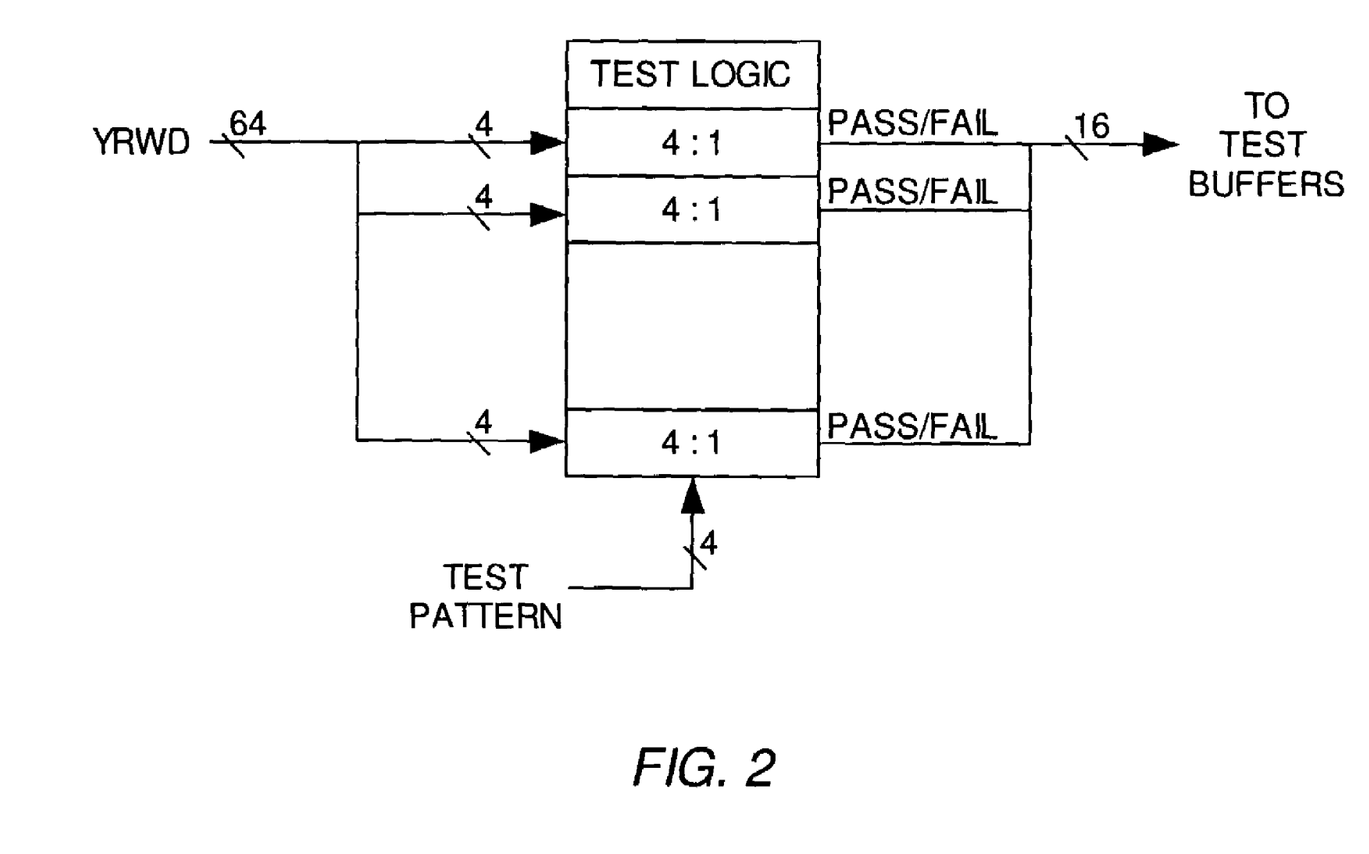
FIG. 2 illustrates exemplary compression test logic in accordance with embodiments of the present invention.

As illustrated in FIG. 2, for some embodiments test logic 172, may be configured to reduce (compress) the amount of test data by generating a single pass/fail signal from multiple bits of data read from a corresponding bank. In the illustrated example, the test logic 172 generates a single pass/fail signal for each 4 bits of data read from the banks (e.g., 4 bits formed at a CSL-WL intersection). The pass/fail signal may indicate whether a corresponding 4 bits match predefined test data (e.g., a test data pattern store in a test data register) that was written to corresponding locations in the bank. Assuming 64 bits of data are read from a bank at each access, the test logic 172 may generate 16 bits of compressed test data. The compressed test data may be output to (test) buffers that provide access to the test data during wafer test.

As described above, separate test logic circuits 172 may be provided for each separate group of banks 110, with each test logic circuit 172 receiving, as input data on YRWD lines shared between the banks in the corresponding group. Because the number of data lines is reduced by the compression of the test data, it is possible for embodiments of the present invention to increase wafer test throughput by providing compressed test data for banks in different groups simultaneously over the SRWD data lines.

Figure 3:
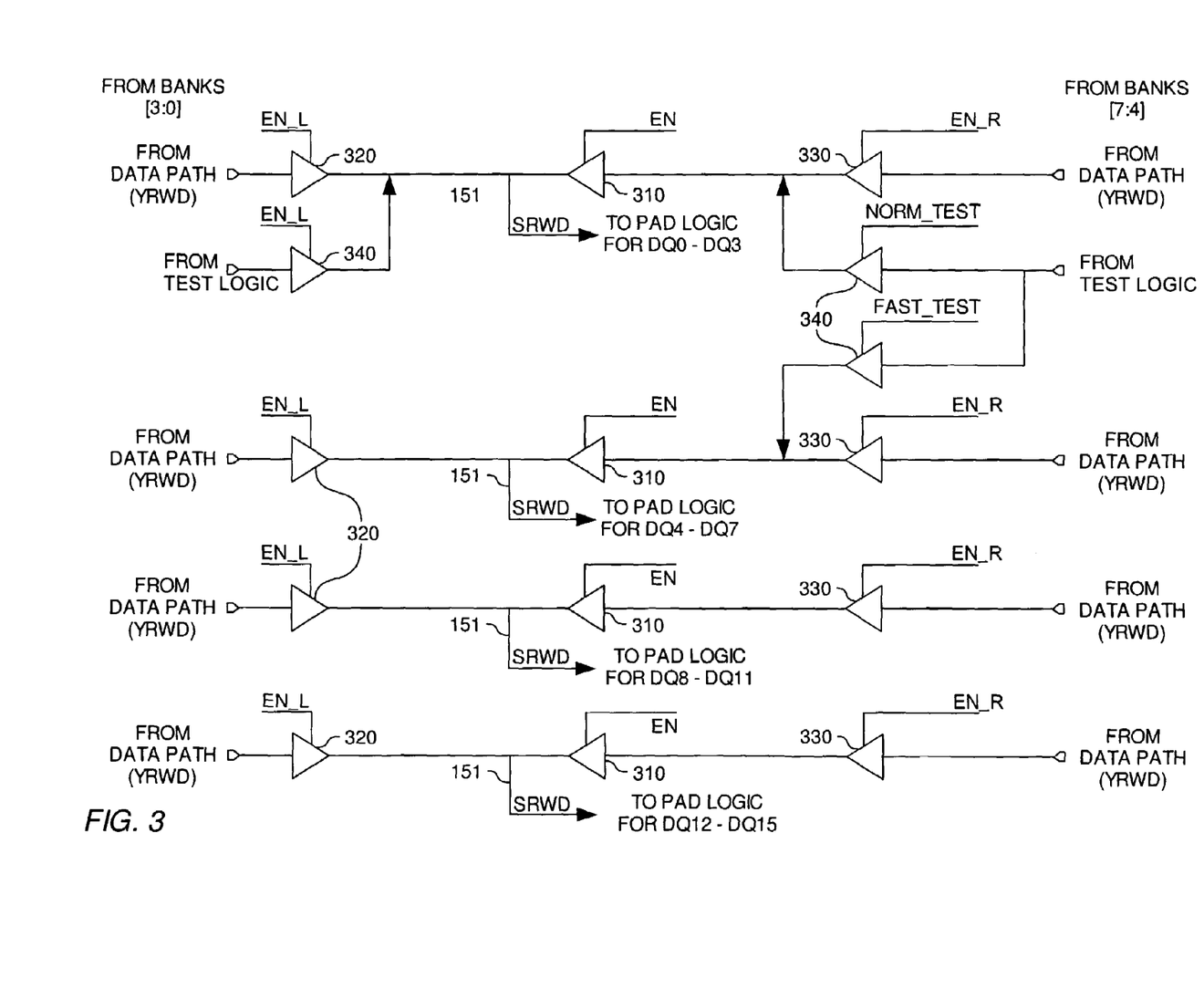
FIG. 3 illustrates an exemplary DRAM data path circuitry in accordance with embodiments of the present invention.

FIG. 3 illustrates data path circuitry that allows compressed test data, generated by test logic for different groups of DRAM banks, to be presented simultaneously on SRWD lines 151. As illustrated, the circuitry includes a set of buffers 310, that allow the SRWD lines 151 to be shared between the groups of banks 110 without contention. The buffers 310 may be referred to as "center part" buffers, for example, because they may be centrally located and used to effectively isolate YRWD lines for group of banks physically located on different (e.g., left and right) sides of a DRAM device during normal (non-test) operation.

As illustrated, each 16 SRWD lines may be routed to pad logic for a corresponding four DQ pads. The pad logic for each DQ pad may, in turn, drive four bits of data out on successive edges of clock cycles. As an example, a first 16 SRWD lines may carry 16 bits of data to be driven out on a first four data pads DQ0-DQ3. On DQ0, the first four bits of data carried on the SRWD lines may be driven out, in sequence, for example, as Even1 (E1), Odd1 (O1), Even2 (E2) and Odd2 (O2) data bits on rising and falling edges of two successive clock cycles. The remaining bits of data may be driven out in a similar manner on DQ1-DQ15.

Figure 4A:
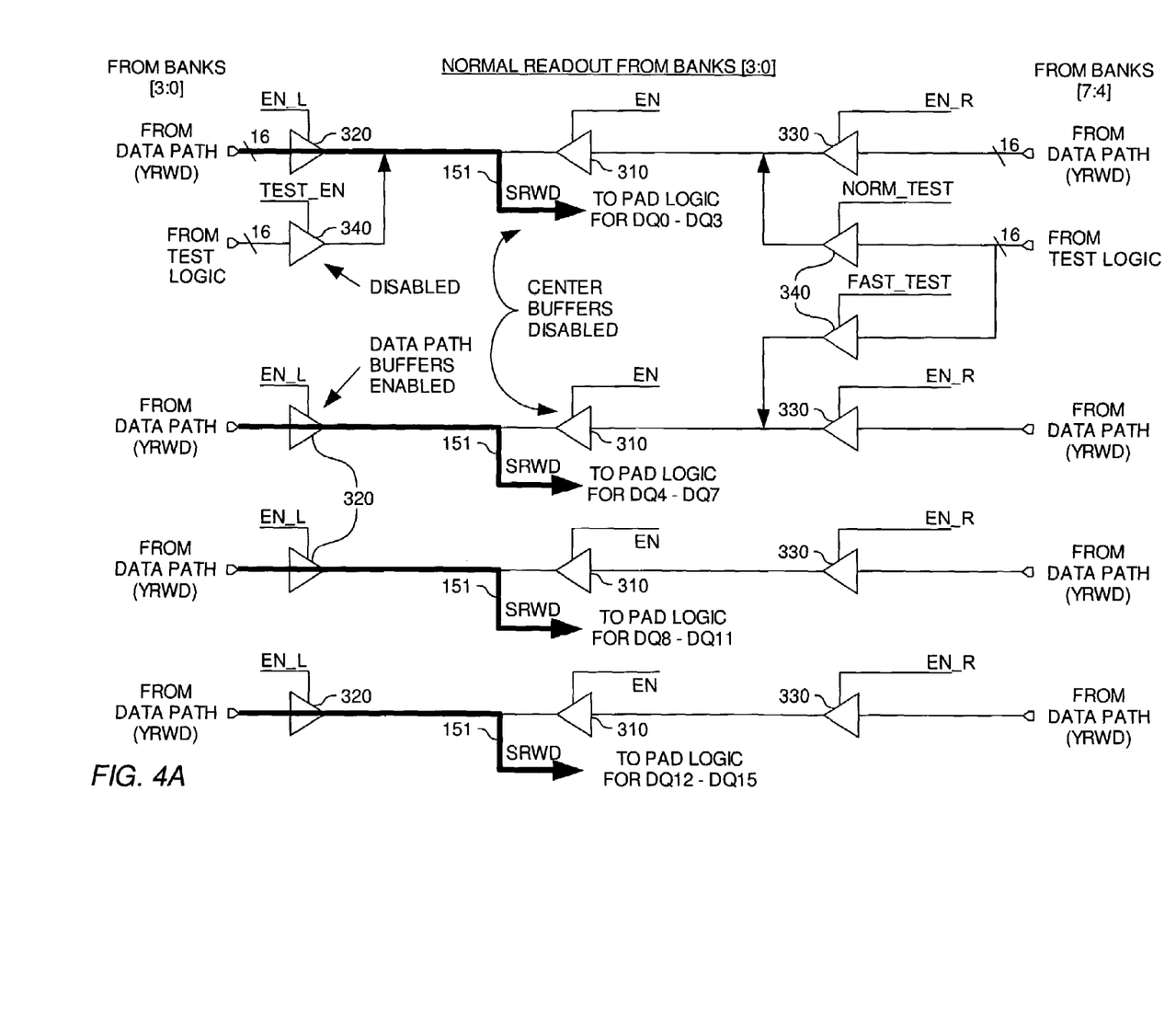
FIGS. 4A and 4B illustrate the flow of data from different groups of banks using the exemplary data path circuitry of FIG. 3.
Figure 4B:
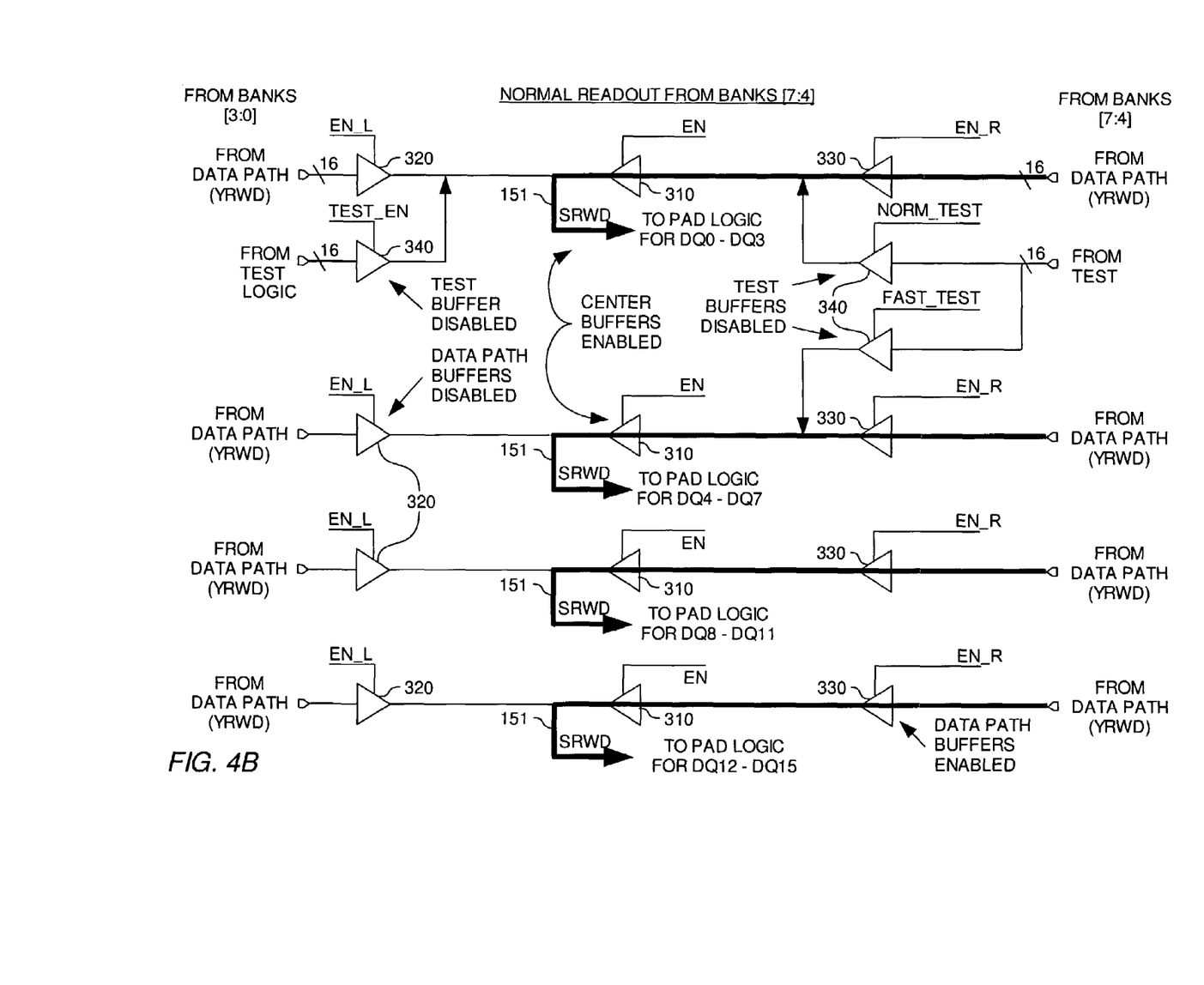

The function of the center part buffers 310 during normal operation is illustrated in FIGS. 4A and 4B, which show the flow of data during an access to a first group of banks (banks[3:0]) and a second group of banks (banks[7:4]), respectively. As illustrated in FIG. 4A, in order to access data from a bank in the first group, the center point buffers 310 may be disabled, while enabling a second set of "data path" buffers 320, thereby providing a data path from YRWD lines of the first group of banks to the SRWD lines.

As illustrated in FIG. 4B, in order to access data from a bank in the second group (banks[7:4]), the center point buffers 310 may be enabled along with a third set of data path buffers 330, while disabling the second set of "data path" buffers 320, thereby providing a data path from YRWD lines of the first group of banks to the SRWD lines. A set of test data buffers 340 may be disabled to isolate test data lines from the SRWD lines during normal accesses to the banks 110 in either group. The test data buffers 340 may also be used to couple test data lines to the SRWD lines during test mode.

Exemplary Test Operations with Parallel Bank Access

Figure 5:
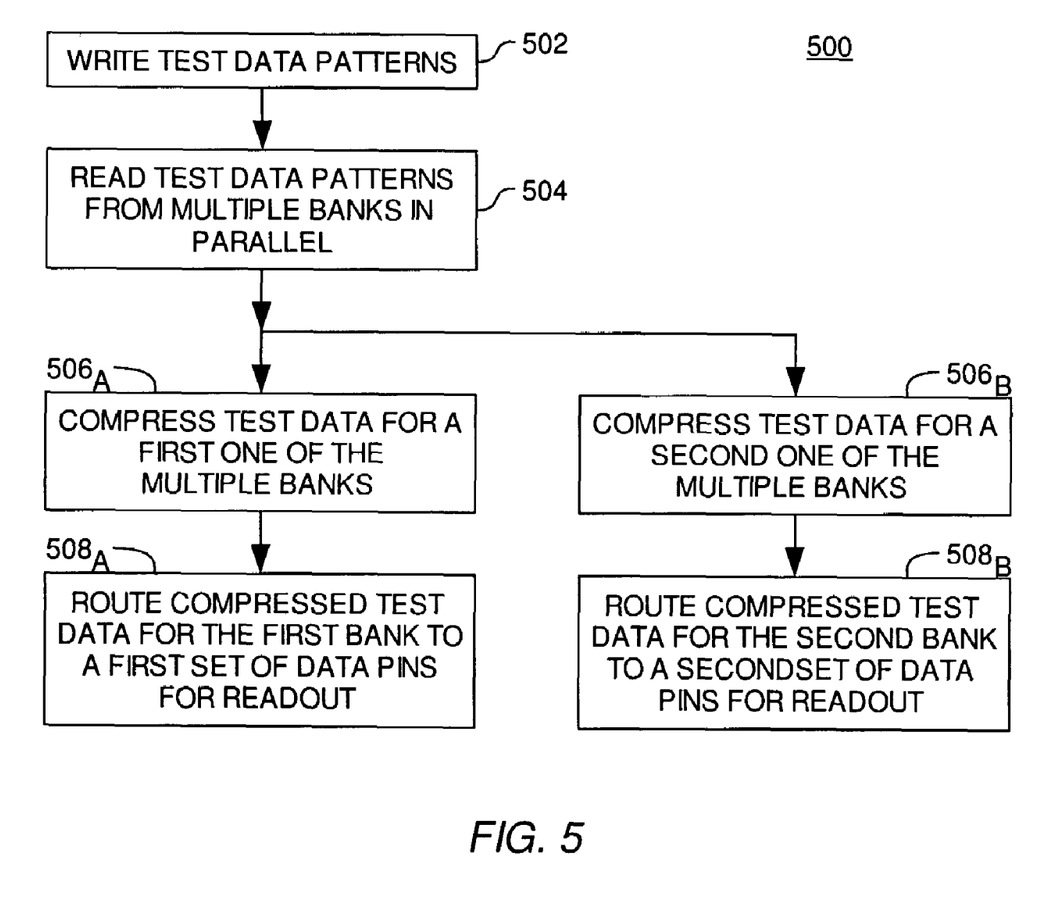
FIG. 5 is a flow diagram of exemplary operations for testing a DRAM device utilizing parallel reads of multiple banks, in accordance with embodiments of the present invention.

FIG. 5 is a flow diagram of exemplary operations 500 for testing a DRAM device utilizing parallel reads of multiple banks, in accordance with embodiments of the present invention. The operations 500 may be described with reference to FIG. 6, which illustrates the flow of compressed test using the exemplary data path circuitry described above.

The operations 500 begin, at step 502, by writing test data patterns. For some embodiments, the same test data pattern may be written to multiple locations in all banks. For example, as previously described, the same 4-bit test pattern may be written to four locations formed at each intersection between a column select line (CSL) and word line (WL).

At step 504, test data patterns may be read from multiple banks in parallel. The sharing of common data lines described thus far, generally forbids the simultaneous read of any 2 banks of memory during normal operations, to avoid data contention. As an example, a read from multiple banks within a group would result in data contention on shared YRWD lines, while a read from banks in different groups would result in data contention on SRWD lines.

However, simultaneous read from multiple banks is possible, by circumventing the SRWD data sharing and combining compressed test data generated from banks in different groups. At every read command during test, 2 banks (e.g., one in each group on different sides of the device) are accessed. For some embodiments, this may be achieved by modifying access logic so that, during such a test mode, Bank address bit 2 (BA[2]) is treated as a "don't care" bit. In other words, when a read command is issued to access bank 0, both bank 0 and bank 4 may be accessed to deliver a burst of data (on their respective YRWD lines). Similarly, when a read command is issued to access banks 1, 2, and 3, banks 1 and 5, 2 and 6, and 3 and 7 may be accessed, respectively.

At steps 506A and 506B, performed in parallel, test data for first and second of the multiple banks are compressed. In other words, the data on the YRWD lines for each group of banks may be compressed (e.g., 4:1 as described above), which means that only a portion of the SRWD lines used for standard Read operations are used for test mode. As an example, the 16 bits resulting from the compression of 64 bits from the first bank and the 16 bits resulting from the read of the 64 bits from the second bank may be read out as 32 bits of pass/fail bits.

At steps 508A and 508B, performed in parallel, compressed test data for the first and second banks are routed to first and second sets of data pins, respectively. In other words, the Data read from one group of banks is not written onto the same 16 SRWD lines because this would lead to a data contention.

Figure 6:
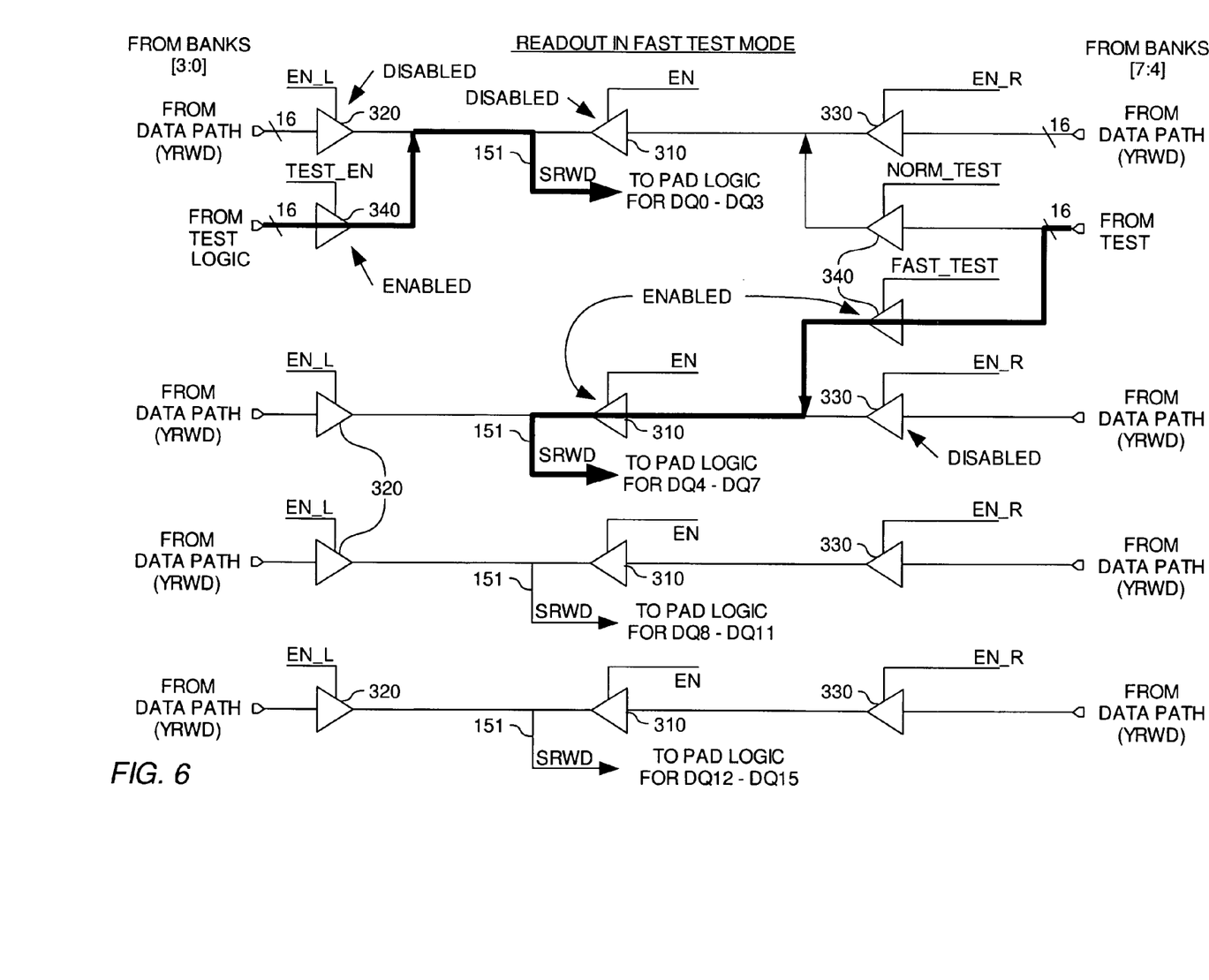
FIG. 6 illustrates the flow of compressed data using the exemplary data path circuitry of FIG. 3.

As illustrated in FIG. 6, 16 bits of compressed data for the first bank may be routed as 16 bits to be driven out on data pads DQ [3:0] by disabling the first set of data path buffers 320, and enabling the test data buffers 340 while disabling all but one of the center part buffers 310. By enabling that one center part buffer 310, 16 bits of compressed data for the second bank may be routed as 16 bits to be driven out on data pads DQ [7:4] by disabling the second set of data path buffers 330, and enabling the test data buffers 340. Continuing with the example above, 128 bits of data read from 2 banks may be routed as 32 bits of pass/fail data read out on data pads DQ[7:0].

Reading out twice the test data than in conventional compressed testing results in an effective doubling of wafer test throughput. For some embodiments, parallel reads of multiple banks may be enabled as a special test mode and circuitry may also be included to allow for a "standard" compressed test mode with compressed data from all banks driven onto the same shared SRWD lines. For embodiments that include such circuitry, when the special (double rate) compressed test mode is enabled, buffers corresponding to the normal compressed test mode may be disabled (tristated) to avoid data contention. Similarly, when the normal compressed mode is enabled, buffers corresponding to the double rate compressed test mode may be disabled. For some embodiment either or both test modes may be set, for example, via one or more bits set in a mode register via a mode register set command.

While the above description has reference to a particular embodiment having eight banks of DRAM cells, divided into two groups of four, those skilled in the art will recognize that this embodiment is exemplary only and the techniques described herein may be applied to a wide variety of architectures. As an example, four groups of banks, resulting in 16 compressed data bits each, may be read out on 64 SRWD lines, with the addition of more buffers controlling the data paths. Further, one skilled in the art will recognize that, for some embodiments, test compression logic may be moved physically closer to the banks, allowing compressed test data to be transferred, to similar effect on YRWD lines.

CONCLUSION

Compared to conventional compressed test modes, embodiments of the present invention may provide improved throughput by utilizing parallel access to multiple banks.

While the foregoing is directed to embodiments of the present invention, other and further embodiments of the invention may be devised without departing from the basic scope thereof, and the scope thereof is determined by the claims that follow.

What is claimed is:

1. A method of testing a memory device in a first test mode, comprising:
    reading a plurality of bits from multiple banks of the memory device in parallel;
    generating, from the plurality of bits read from each bank, a reduced number of compressed test data bits;
    routing the compressed test data bits from each bank to a common set of data lines shared between the multiple banks; and
    providing the compressed test data bits as output on one or more data pins of the memory device, wherein generating the reduced number of compressed data bits comprises comparing sets of the plurality of data bits to one or more known test data patterns previously written to the memory banks.

2. The method of claim 1, wherein routing the compressed test data bits from each bank to a common set of data lines shared between the multiple banks comprises:
    routing a first set of compressed test data bits generated from a plurality of bits read from a first bank to a first subset of the common set of data lines; and
    routing a second set of compressed test data bits generated from a plurality of bits read from a second bank to a second subset of the common set of data lines, wherein compressed test data bits generated from a plurality of bits read from the second bank are routed to the first subset of the common set of data lines when the memory device is in a second test mode.

3. The method of claim 1, wherein generating the reduced number of compressed test data bits comprises generating a single bit based on at least four data bits read from a memory bank.

4. The method of claim 1, wherein each bit in a set of bits compared to a known test data pattern is formed at an intersection of a column select line and a word line.

5. The method of claim 1, wherein the first bank is selected from a first group of four or more banks and the second bank is selected from a second group of four or more banks.

6. A dynamic random access memory (DRAM) device, comprising:
   at least two groups of memory cell banks, wherein a first set of common data lines is shared between banks in each group and a second set of common data lines is shared between the groups;
   one or more test logic circuits, each configured to generate, from a plurality of bits read from a bank, a single pass/fail bit indicating whether the corresponding plurality of bits matches predefined test data; and
   logic configured to route a plurality of bits from multiple banks of the memory device to the test logic circuits in parallel, route the compressed test data bits from each bank to the first set of common data lines shared between the groups, and provide the compressed test data bits as output on one or more data pins of the memory device.

7. The memory device of claim 6, wherein:
   the plurality of banks comprises at least two groups of memory banks, with banks in each group sharing a first common set of data lines and the groups sharing a second set of common data lines; and
   the one or more test logic circuits comprise a test logic circuit for each group of memory banks.

8. The memory device of claim 7, wherein the test logic for each group of memory banks generates a reduced number of test data bits from data received on the first common set of data lines and routes the reduced number of compressed data bits to the second set of common data lines.

9. The memory device of claim 6, wherein the plurality of banks comprises more than four banks.

10. The memory device of claim 6, wherein the logic is configured to provide multiple bits of the compressed test data bits as output on one or more data pins of the memory device on successive clock cycle edges.

11. A system, comprising:
   a tester; and
   one or more memory devices, each comprising a plurality of banks of memory cells and logic configured to, when the memory device has been placed in a test mode by the tester, read a plurality of bits from multiple banks of the memory device in parallel, generate, from the plurality of bits read from each bank, a reduced number of one or more compressed test data bits, route the compressed test data bits from each bank to a common set of data lines shared between the multiple banks, and provide the compressed test data bits as output on one or more data pins, wherein the logic is configured to generate a reduced number of one or more compressed data bits by comparing bits of data read to predefined test data in a register.

12. The system of claim 11, wherein the multiple banks comprise a first bank selected from a first group of four or more banks and a second bank selected from a second group of four or more banks.

13. The system of claim 11, wherein the tester is configured to place the one or more memory devices in the test mode via a mode register set (MRS) command.

* * * * *